US009014382B2

(12) United States Patent
Van De Par et al.

(10) Patent No.: US 9,014,382 B2
(45) Date of Patent: Apr. 21, 2015

(54) CONTROLLER FOR A HEADPHONE ARRANGEMENT

(75) Inventors: Steven Leonardus Josephus Dimphina Elisabeth Van De Par, Goirle (NL); Armin Gerhard Kohlrausch, Eindhoven (NL)

(73) Assignee: Koninklijke Philips N.V., Eindhoven (NL)

( * ) Notice: Subject to any disclaimer, the term of this patent is extended or adjusted under 35 U.S.C. 154(b) by 286 days.

(21) Appl. No.: 13/521,065

(22) PCT Filed: Jan. 26, 2011

(86) PCT No.: PCT/IB2011/050333

§ 371 (c)(1), (2), (4) Date: Jul. 9, 2012

(87) PCT Pub. No.: WO2011/095912

PCT Pub. Date: Aug. 11, 2011

(65) Prior Publication Data

US 2013/0101126 A1 Apr. 25, 2013

(30) Foreign Application Priority Data

Feb. 2, 2010 (EP) .................................... 10152397

(51) Int. Cl.
*H03G 3/20* (2006.01)
*H04R 1/10* (2006.01)

(52) U.S. Cl.
CPC ............ *H04R 1/1083* (2013.01); *H04R 1/1041* (2013.01); *H04R 2430/01* (2013.01)

(58) Field of Classification Search
USPC ........................................................... 381/57
See application file for complete search history.

(56) References Cited

U.S. PATENT DOCUMENTS

| | | | | |
|---|---|---|---|---|
| 5,509,081 | A | 4/1996 | Kuusama | |
| 7,817,803 | B2 * | 10/2010 | Goldstein | 381/56 |
| 2003/0118196 | A1 * | 6/2003 | Woolfork | 381/74 |
| 2007/0053528 | A1 | 3/2007 | Kim et al. | |
| 2007/0129828 | A1 | 6/2007 | Lee et al. | |
| 2007/0253571 | A1 | 11/2007 | Li et al. | |
| 2008/0013744 | A1 * | 1/2008 | Von Dach et al. | 381/56 |
| 2009/0245537 | A1 | 10/2009 | Morin | |
| 2009/0290721 | A1 | 11/2009 | Goldstein et al. | |

FOREIGN PATENT DOCUMENTS

| | | | |
|---|---|---|---|
| CN | 200947588 | | 9/2007 |
| GB | 2455827 | A | 6/2009 |
| JP | 558093016 | A | 6/1983 |
| JP | 2008177629 | A | 7/2008 |
| JP | 2010021627 | A | 1/2010 |
| TW | 200644697 | | 12/2006 |
| WO | 2009109237 | A1 | 9/2009 |

* cited by examiner

*Primary Examiner* — Alexander Jamal

(57) ABSTRACT

A controller for a headphone arrangement (101) comprises a drive circuit (203) which generates a signal for an earphone (105) from an audio signal. The drive signal is fed to the earphone (105) causing this to reproduce the audio signal. A first circuit (217) determines a signal level for the audio signal and a second circuit (209) determines an ambient sound level from a microphone signal from a microphone (109). A third circuit (211) determines an attenuated ambient sound level for the user from the microphone signal and an ambient sound attenuation of the earphone (105). A gain controller (205) controls the gain of the audio drive circuit (203) for the audio signal in response to the ambient sound level, the attenuated ambient sound level and the signal level. The dynamic and automated gain control may be used to reduce the risk of hearing damage e.g. by automatically restricting the sound level experienced by the user to the ambient sound level.

15 Claims, 3 Drawing Sheets

CONTROLLER FOR A HEADPHONE ARRANGEMENT

FIELD OF THE INVENTION

The invention relates to a controller for a headphone arrangement and in particular, but not exclusively, to limiting of volume levels from an earphone of the headphone arrangement.

BACKGROUND OF THE INVENTION

The advent and prevalence of e.g. portable audio devices has led to the widespread use of earphones for providing audio to users. Due to the proximity of the earphone to the ear, it is possible to generate high sound pressure levels. As this can furthermore be achieved without inconveniencing other people, it has led to a user behavior that often results in dangerously high sound pressure levels being applied resulting in a high risk of hearing damage. For example, the widespread use of in-ear earphones has resulted in many users often listening to audio at excessive levels.

The risk of hearing damage due to listening to e.g. portable audio players using earphones is of growing concern. For example, regulatory restrictions on the maximum volume levels that can be provided by portable devices are being discussed or implemented in many jurisdictions. However, such fixed restrictions tend to be inflexible and provide unsatisfactory protection as they may not be suitable for the specific scenario in which the portable audio player is used.

Indeed, the risk of hearing damage in particular arises due to the high playback levels that are possible with portable audio players and to the frequent use of such audio players in conditions that may have a high level of background noise. Indeed, the use of portable audio devices has resulted in headphones being used in more diverse environments and increasingly often being used in environments with a high level of ambient sounds or noise. This results in the difficult trade-off between a volume level that is sufficiently high to make the desired audio dominant and the desire to keep the volume level sufficiently low to avoid hearing damage. Users in a noisy environment will tend to increase the volume to levels that may have damaging effects if sustained for longer periods. Therefore, there is a desire for allowing the volume level and thus the produced sound pressure levels to be automatically controlled to provide a better trade off than typically selected by users. Accordingly, there is a desire to provide a better control of the volume of audio presentation such as e.g. from portable audio players. In particular, it may be desired to implement automatic volume controls that restrict the generated sound levels to a level that is unlikely to cause hearing damage.

US20070129828A1 discloses a system wherein a portable audio player may automatically adapt the volume such that the risk of hearing damage may be reduced. The approach is based on a restriction of the accumulated sound dosage from the audio player such that this does not exceed values that are considered to cause hearing damage. This is accomplished by defining the maximum allowed volume setting on the portable device based on the exposure time and the quiet time in between which allows the ear to recover from the sound exposure.

However, the approach may not be optimal in all scenarios. For example, a disadvantage of any system that estimates the potential for hearing loss based only on the usage of the audio player is that it does not reflect or take into account other sounds that the user may be exposed to. For example, it cannot be ensured that a quiet time in which the audio player is not used is indeed quiet and that the user is not exposed to a possibly high sound level. Therefore, it cannot be guaranteed that the ear is able to recover during the time in-between two sessions of listening to the audio player and therefore the risk of hearing damage remains.

Hence, an improved control of volume levels would be advantageous and in particular a system allowing increased flexibility, increased adaptability, reduced complexity, increased hearing protection and/or improved performance would be advantageous.

SUMMARY OF THE INVENTION

Accordingly, the Invention seeks to preferably mitigate, alleviate or eliminate one or more of the above mentioned disadvantages singly or in any combination.

According to an aspect of the invention there is provided a controller for a headphone arrangement comprising: an audio drive circuit for generating a drive signal for an earphone of the headphone arrangement from an audio signal, and for feeding the drive signal to the earphone to cause the earphone to reproduce the audio signal at a first sound level; a first circuit for determining a signal level for the audio signal; a receiver for receiving a microphone signal from a microphone; a second circuit for determining an ambient sound level from the microphone signal; a third circuit for determining an attenuated ambient sound level for the user from the microphone signal and an ambient sound attenuation of the earphone; and a gain controller for controlling a gain of the audio drive circuit for the audio signal in response to the ambient sound level, the attenuated ambient sound level and the signal level.

The invention may allow improved control of the sound level presented to a user. The invention may in particular allow an improved volume setting that may automatically and dynamically be adapted to the specific conditions experienced. The invention may allow a particularly accurate adaptation and may in many embodiments allow an improved protection against hearing damage.

The signal level may be a dynamically varying energy measure that depends on the current substantially instantaneous energy level of the audio signal. The ambient sound attenuation may reflect the attenuation or shielding effect of the ambient sound provided by the earphone when in use. The ambient sound attenuation may be an assumed or estimated attenuation and may specifically be a predetermined ambient sound attenuation determined e.g. by measurements or calculations during the design, manufacturing or test phase of the earphone.

In accordance with an optional feature of the invention, the gain controller is arranged to determine a target sound pressure level for the first sound level in response to the ambient sound level and the attenuated ambient sound level, and to restrict the gain of the audio drive circuit to not be above a first gain resulting in the combination of the attenuated ambient sound level and the first sound level corresponding to the target sound pressure level.

This may provide improved performance and/or reduced complexity and/or facilitated operation or implementation.

In particular, the use of a target sound pressure level based on the both the ambient sound level and the attenuated ambient sound level allows the earphone to be controlled to provide a sound pressure level that is not only adapted to the specific environment but also directly reflects the impact on the listener. In particular, it may allow a more accurate control of the combined sound pressure level experienced by the user thereby e.g. allowing a more accurate and effective protection against hearing damage. In particular, the approach may allow the sound pressure level from the audio signal to be restricted to a level that in view of the ambient sound and the specific shielding of the earphone does not result in potential hearing damage. Furthermore, the sound pressure level generated from the earphone is not only dependent on the ambient sound level perceived by the user (i.e. the attenuated ambient sound level) but also reflects the actual sound level of the environment. Thus, the system may e.g. provide different sound levels from the earphone in scenarios that have the same ambient sound levels experienced by the user but originating from different shielding effects and different audio environments.

In some embodiments the gain controller is arranged to bias the gain of the audio drive circuit towards a first gain resulting in the combination of the attenuated ambient sound level and the first sound level corresponding to the target sound pressure level.

This may provide a highly advantageous gain/volume control and may in many scenarios allow a desirable automatic and dynamic setting of the volume level without requiring any user input.

In accordance with an optional feature of the invention, the target sound pressure level is within 6 dB of the ambient sound level.

This may provide improved performance and may in particular provide efficient mitigation of the risk of hearing damage in many embodiments and scenarios.

The approach may restrict the combined sound pressure level that is experienced by the user to a level that is maintained sufficiently close to the ambient sound level. Thus, the user will experience a (maximum) sound level which is relatively constant regardless of whether the user consumes the audio signal or not. For example, for a portable audio player embodiment, a user will experience a similar sound pressure level regardless of whether he/she is using the audio player or not. Thus, the additional sound dosage incurred by the consumption of the audio player may be kept to a desired level and may even be reduced relative to the ambient sound.

The invention may thus result in the hearing impact of consuming the sound using the headphone arrangement being maintained sufficiently close to the hearing impact caused by the audio environment itself. Generally, sound environments are kept within sound pressure levels that do not risk causing hearing damage and accordingly the approach will ensure that the consumption of the audio signal will not risk causing hearing damage. Furthermore, if the user is exposing him/herself to dangerous environments, the consumption of the audio signal using the earphones will not result in any increased danger and will thus be fully at the responsibility of the user.

In some embodiments, the target sound pressure level is not above the ambient sound level. Thus, in some embodiments the system may be used to ensure that the total sound dosage is below or equal to the sound dosage that would be experienced by a user without a headphone in the audio environment.

In accordance with an optional feature of the invention, the target sound pressure level is substantially equal to the ambient sound level.

This may provide improved performance and may in particular provide efficient mitigation of the risk of hearing damage in many embodiments and scenarios.

The approach may restrict the combined sound pressure level that is experienced by the user to a level that is maintained close to the ambient sound level. Thus, the user will experience a (maximum) sound level which is substantially constant regardless of whether the user consumes the audio signal or not. For example, for a portable audio player embodiment, a user will experience substantially the same sound pressure level regardless of whether he/she is using the audio player or not. Thus, the additional sound dosage may be kept substantially the same regardless of whether the user is consuming the audio signal or not.

The invention may thus result in the hearing impact of consuming the sound using the headphone arrangement being maintained sufficiently close to the hearing impact of the audio environment the user is experiencing. Generally, sound environments are kept within sound pressure levels that do not risk causing hearing damage and accordingly the approach will ensure that the consumption of the audio signal will not risk in hearing damage. Furthermore, if the user is exposing him/herself to dangerous environments, the consumption of the audio signal using the earphones will not result in an increased danger and will thus be at the responsibility of the user.

In accordance with an optional feature of the invention, the gain controller is arranged to restrict the gain to an interval above a minimum value corresponding to the first sound level having a predetermined minimum value.

This may provide improved functionality and a better user experience in many environments. The approach may specifically ensure that the sound pressure level of the audio signal is never reduced to an undesired low level even in very quiet environments. Specifically, the predetermined value may be set to a low level that is not considered to cause any hearing damage even with extended and continuous use. For example, the predetermined value may be set to 70 dB SPL which will ensure a comfortable listening experience while ensuring that the risk of hearing damage is virtually non-existent.

In accordance with an optional feature of the invention, the first circuit is arranged to filter the audio signal with a frequency response reflecting a frequency response of the earphone when reproducing the audio signal.

This may provide an improved gain control and may in particular allow a more accurate adaptation of the operation to the specific experience of the user.

In accordance with an optional feature of the invention, the third circuit is arranged to filter the microphone signal with a frequency response reflecting a frequency response of the ambient sound attenuation of the earphone.

This may provide an improved gain control and may in particular allow a more accurate adaptation of the operation to the specific experience of the user.

In accordance with an optional feature of the invention, the first circuit is arranged to generate the signal level as a low pass filtered signal level having a 3 dB cut-off frequency of no less than 5 Hz.

This may provide an improved listening experience and may in particular allow a fast adaptation to the specific characteristics of the music while maintaining any detrimental impact on of the gain variations sufficiently low.

In accordance with an optional feature of the invention, the second circuit is arranged to generate the ambient sound level as a low pass filtered ambient sound level having a 3 dB cut-off frequency of no less than 5 Hz.

This may provide an improved listening experience and may in particular allow a fast adaptation to the specific characteristics of the music while maintaining any detrimental impact on of the gain variations sufficiently low.

In accordance with an optional feature of the invention, a time constant for reducing the gain is no more than 20 msec.

This may provide an improved listening experience and may in particular allow a fast adaptation to the specific characteristics of the music while maintaining any detrimental impact on of the gain variations sufficiently low.

The time constant represents the time it takes the gain to reach 1-1/e•63% of its final (asymptotic) value following a step change.

In accordance with an optional feature of the invention, a time constant for increasing the gain is no more than 200 msec.

This may provide an improved listening experience and may in particular allow a fast adaptation to the specific characteristics of the music while maintaining any detrimental impact on of the gain variations sufficiently low.

The time constant represents the time it takes the gain to reach 1-1/e•63% of its final (asymptotic) value following a step change.

In accordance with an optional feature of the invention, a time constant for increasing the gain is no less than twice as high as a time constant for decreasing the gain.

This may provide an improved listening experience and may in particular allow an improved trade off between the risk of hearing damage and the reduction of any audible degradation due to the gain variations.

The time constant represents the time it takes the gain to reach 1-1/e•63% of its final (asymptotic) value following a step change.

In accordance with an optional feature of the invention, the gain controller is arranged to perform a frequency weighting of at least one of: the signal level; the ambient sound level; and the attenuated ambient sound level.

This may provide improved performance and may in particular allow an improved trade off between the risk of hearing damage and the reduction of any audible degradation due to the gain variations.

In accordance with an optional feature of the invention, the controller is arranged to perform a frequency selective gain adjustment.

This may provide improved performance and may in particular allow an improved trade off between the risk of hearing damage and the reduction of any audible degradation due to the gain variations.

According to an aspect of the invention there is provided a method of gain control for a headphone arrangement, the method comprising: generating a drive signal for an earphone of the headphone arrangement from an audio signal; feeding the drive signal to the earphone to cause the earphone to reproduce the audio signal; determining a signal level for the audio signal; receiving a microphone signal from a microphone; determining an ambient sound level from the microphone signal; determining an attenuated ambient sound level for the user from the microphone signal and an ambient sound attenuation of the earphone; and controlling a gain of for the drive signal in response to the ambient sound level, the attenuated ambient sound level and the signal level.

These and other aspects, features and advantages of the invention will be apparent from and elucidated with reference to the embodiment(s) described hereinafter.

BRIEF DESCRIPTION OF THE DRAWINGS

Embodiments of the invention will be described, by way of example only, with reference to the drawings, in which.

DETAILED DESCRIPTION OF SOME EMBODIMENTS OF THE INVENTION

The following description focuses on embodiments of the invention applicable to a stereo headphone used in connection with a portable audio player. However, it will be appreciated that the invention is not limited to this application but may be applied to many other audio rendering applications using one or more earphones.

Figure 1:
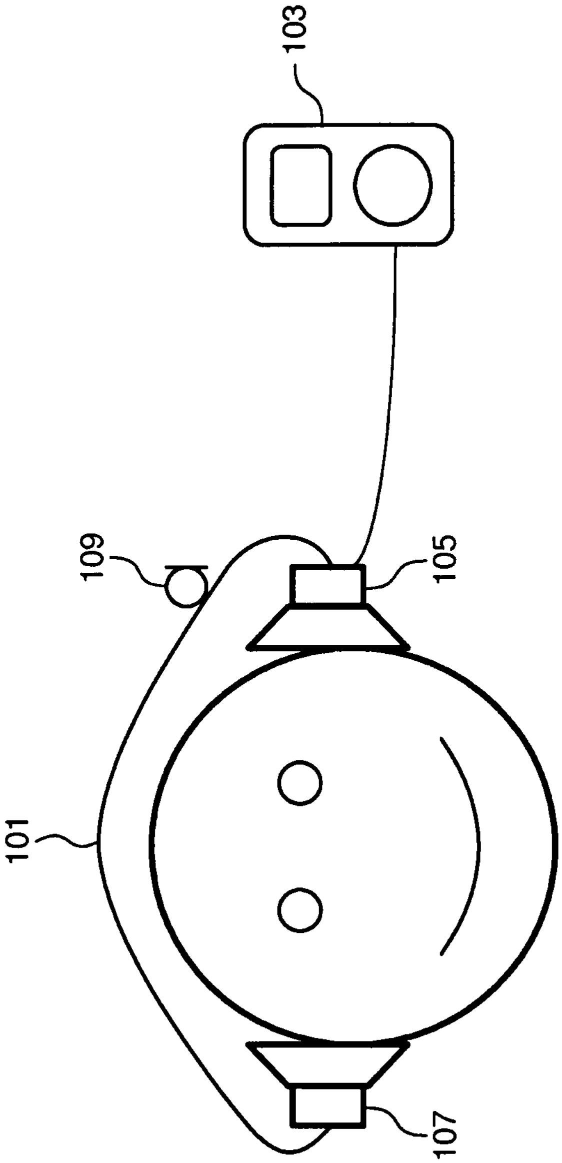
FIG. 1 illustrates an example of a usage of a headphone arrangement in accordance with some embodiments of the invention.

FIG. 1 illustrates an example of a use scenario for a headphone arrangement in accordance with some embodiments of the invention. In the example, a user is listening to a set of headphones 101 that are connected to a portable audio player 103. In addition to two earphones 105, 107 which are placed around the user's ear, the headphone arrangement 101 comprises a microphone 109 which in the example is mounted on the headphones 101. The microphone 109 is arranged to capture the ambient sound environment. In the following it is assumed that the microphone 109 is arranged such that the sound contribution from the sound produced from the earphones 105, 107 is negligible compared to the ambient sound. This will typically be the case due to the attenuation by the earphones 105, 107 and the relatively low sound levels of headphones 101. However, in some embodiments, the microphone signal may be compensated for any contribution from the earphone sounds. For example, echo cancelling algorithms may be applied to remove any contribution from the earphones 105, 107.

In the example, a headphone comprising two earphones is shown. However, it will be appreciated that in other embodiments the headphone may comprise only a single earphone and indeed the headphone may consist in a single earphone.

In the example each earphone is furthermore illustrated as a circumaural earphone but it will be appreciated that in other embodiments the earphones may be other types of earphones including for example supra-aural headphones, earbuds or canalphones, also known as in-ear monitors or in-ear earphones.

In the example of FIG. 1 the portable audio player 103 includes functionality for automatically controlling the sound pressure level generated by the earphones 105, 107 dependent on the ambient sound captured by the microphone 109. The portable audio player 103 may specifically automatically adapt the volume to environmental sound conditions such that the risk of hearing damage is reduced. For example, the portable audio player 103 may control the volume such that the user has limited or no additional sound exposure due to listening to the portable audio player 103.

Figure 2:
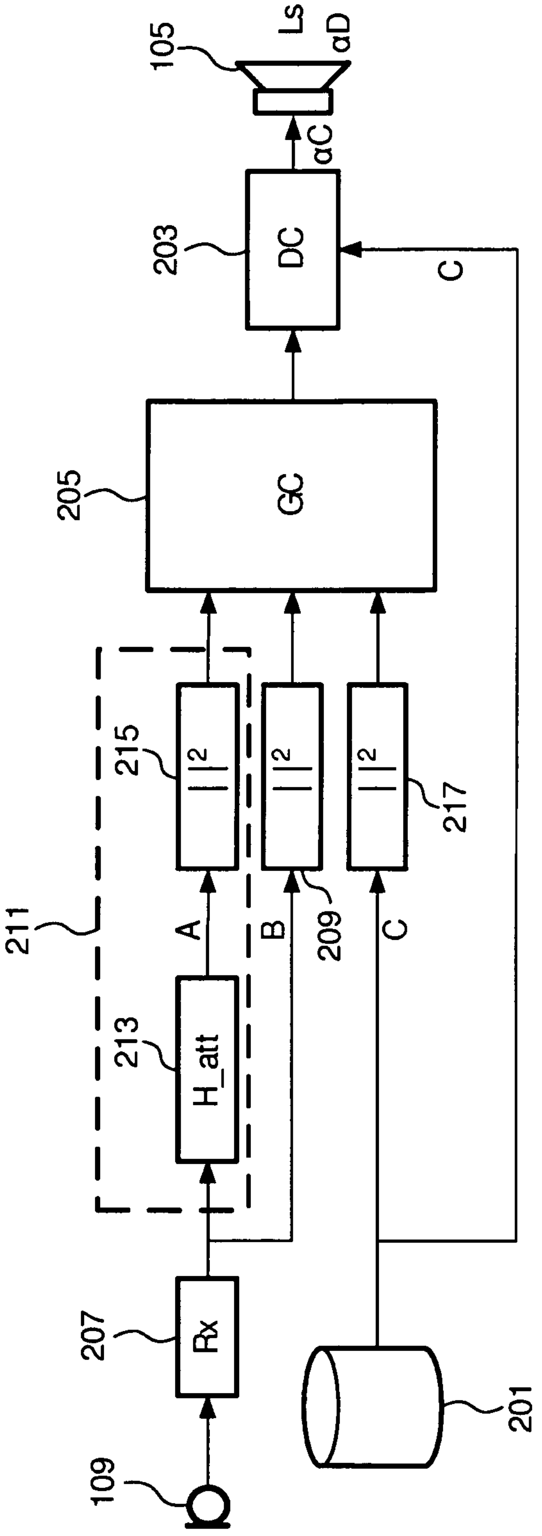
FIG. 2 illustrates an example of a controller for a headphone arrangement in accordance with some embodiments of the invention.

The portable audio player 103 comprises a controller which generates drive signals for the headphone 101 such that the desired audio is reproduced. An example of a controller is illustrated in FIG. 2. In the example of a stereo headphone, each earphone may be considered independently and accordingly the following description will focus on a description for only one earphone. It will be appreciated that the described approach may in parallel be applied to each earphone of a stereo headphone, e.g. using the same microphone signal, which may further prevent or reduce a distortion of the stereo image.

In the example, the audio to be reproduced is provided by a suitable audio source 201 which in the specific example is an internal memory of the portable audio player 103. In the specific example, the audio source 201 provides music signals. The audio signal is provided to a drive circuit 203 which generates a drive signal for the earphone 105 from the audio signal. The drive signal is fed to the earphone 105 such that this reproduces the audio signal at a desired sound level.

In the specific example, the controller is implemented predominantly in the digital domain. Thus, the audio signal may be stored as a digital signal in the audio source 201 and may be predominantly processed as a digital signal. It will be appreciated that the drive circuit 203 will in this case typically comprise a D/A converter with subsequent analog audio amplification.

The drive circuit 203 is coupled to a gain controller 205 which is arranged to control the effective gain of the drive circuit for the audio signal. Thus the gain controller 205 controls the volume of the sound signal that is generated by the earphone 105. It will be appreciated that the gain of the drive circuit 203 may adjusted in the analog domain (e.g. by changing the amplification of the analog audio amplifier), in the digital domain (e.g. by a multiplication of a gain value and the audio samples) or both.

The gain controller 205 is arranged to control the gain/volume based on estimates of the ambient sound level that exists in the audio environment, an attenuated ambient sound level reflecting the ambient sound level that is experienced by the user due to the shielding provided by the earphone, and a signal level measure for the audio signal.

The ambient sound level is estimated on the basis of the sound captured by the microphone 109. Thus, it is assumed that the sound captured by the microphone 109 corresponds to the ambient sound in the user's audio environment. This may easily be achieved by locating the microphone 109 proximal to the headphones 101 and specifically the microphone 109 may be mounted on or integrated with the headphone 101.

The signal from the microphone 109 is received by a receiving circuit 207 which may comprise a low noise amplifier, filters, an A/D converter etc as will be known to the skilled person. The receiving circuit 207 is coupled to a first sound level processor 209 which generates an estimate of the ambient sound level captured by the microphone 209. As a specific example, the first sound level processor 209 may simply be determined as an energy or power estimate, e.g. as $$\langle x^2 \rangle = \sum_n x(n)^2,$$

where x are the sample values of the microphone signal provided by the receiving circuit 207, n is a sample index, and the summation is performed over a suitable number of samples to provide the desired dynamic response of the dynamic gain control.

It will be appreciated that the ambient sound level may be represented by any suitable measure. Especially any value that has a monotonic relationship to the sound level of the sound captured by the microphone 109 may be used.

The receiving circuit 207 is coupled to a second sound level processor 211 which determines an attenuated ambient sound level for the user from the microphone signal and an ambient sound attenuation of the earphone 105. The generated value is thus indicative of the sound exposure to the user from the ambient sound taking into consideration the attenuation and shielding that is provided by the earphone 105.

In the example, the second sound level processor 211 comprises an attenuation processor 213 which processes the microphone signal corresponding to an attenuation that is provided by the earphone 105 to the ambient sound. As a simple example, the earphone 105 may simply be estimated to provide a constant attenuation and the attenuation processor 213 may simply attenuate the microphone signal by the same amount. The attenuated signal is fed to an energy estimator 215 which generates an estimate of the attenuated ambient sound level. E.g. similarly to the first sound level processor 209, the energy estimator 215 may determine the attenuated ambient sound level as:

$$\langle x^2 \rangle = \sum_n x(n)^2,$$

where x are the sample values of the microphone signal provided by the attenuation processor 213, n is a sample index, and the summation is performed over a suitable number of samples to provide the desired dynamic response of the dynamic gain control.

It will be appreciated that the attenuated ambient sound level may be represented by any suitable measure. Especially any value that has a monotonic relationship to the sound level of the ambient sound experienced by the user may be used.

The controller furthermore comprises an audio signal level processor 217 which is coupled to the audio source 201 and which receives the audio signal therefrom. The audio signal level processor 217 is arranged to generate a signal level estimate for the audio signal and may specifically generate an energy measure using the same approach as the first sound level processor 209 and the energy estimator 215, i.e.

$$\langle x^2 \rangle = \sum_n x(n)^2,$$

where x are the sample values of the audio signal, n is a sample index and the summation is performed over a suitable number of samples to provide the desired dynamic response of the dynamic gain control.

It will be appreciated that the signal level may be represented by any suitable measure. Especially any value that has a monotonic relationship to the signal level of the audio signal may be used.

The first sound level processor 209, second sound level processor 211, and the audio signal level processor 217 are coupled to the gain controller 205 which receives the estimates/measures for the ambient sound level, the attenuated ambient sound level and the audio signal level.

The gain controller 205 then proceeds to determine the gain/volume setting depending on these values. The use of these specific parameters allows an improved performance in many environments. Indeed, the approach allows a high degree of flexibility and additional degrees of freedom in optimizing the gain and volume for the specific conditions.

Indeed, having a measure of both the audio signal level, the attenuated ambient sound level and the ambient sound level allows the system to be flexible and provide efficient performance with many different types of headphones and audio signals, and in many different audio environments. For example, a common algorithm may be designed which can easily be adapted to a specific set of headphones. The approach may also allow the system to maintain a sound pressure that has different relationships to the attenuated ambient sound level and the ambient sound level. For example, the sound pressure level that is generated from the combination of the audio reproduction and the attenuated ambient sound may not correspond to a simple summation of the individual levels but may further depend on the specific absolute values of the levels. Also, the impact on the user's hearing may be substantially different for the two sound sources. For example, if the audio reproduction is mainly a high frequency signal whereas the ambient sound is substantially flat or predominantly low frequency, the hearing damage impact of the audio being reproduced may be substantially higher for the reproduced audio than for the attenuated ambient sound.

As another example, the attenuation provided by the earphone may be non-linear or frequency selective and therefore a simplistic setting of the gain and volume level based on the ambient sound level will in many scenarios provide suboptimal volume setting.

As a specific example, the approach of FIG. 2 may be used to automatically and dynamically adjust the total sound pressure level experienced by the user to be within a desired margin of the sound level of the audio environment in which the user currently is.

In the example of FIG. 2, the gain controller 205 is arranged to first generate a target value for the sound pressure that is experienced by the user. This target value may specifically be set equal to the ambient sound level resulting in the sound pressure experienced by the user being the same in the scenario where the user is listening to the audio player using the headphones and in the scenario in which the user is not listening to music (and is not wearing headphones).

The gain controller 205 may thus first determine a target value for the sound pressure level that should be experienced by the user. As this sound pressure level will result from the combination of the attenuated ambient sound level and the signal sound level from the reproduced audio, the gain controller 205 may determine a target sound pressure level for the audio reproduction by compensating the target value for the sound pressure level that should be experienced by the user for this attenuated ambient sound level. The resulting audio target pressure level may then be achieved by setting the gain of the drive circuit 203 such that the current audio signal level is amplified to the desired level.

Thus, the controller may continuously and dynamically adjust the gain such that the audio signal is amplified to a level that results in the corresponding sound pressure level in combination with the sound pressure level resulting from the attenuated ambient sound is equal to the ambient sound level in the specific audio environment. Thus, the system will automatically and dynamically track changes in both the audio signal and in the audio environment resulting in e.g. different sound levels when the audio environment changes.

This approach ensures that no extra sound dosage is incurred due to the user listening to the portable audio player. Thus the same sound dosage and exposure is incurred for the audio player listening scenario as for a normal scenario with no headphones being worn. As audio environments are typically controlled to be safe and have very low risk of hearing damage this approach also provides protection against hearing damage while at the same time providing a high degree of flexibility and user freedom. Indeed, even if the user decides to use the audio player in audio environments that are very loud and which may result in hearing damage, no further hearing damage is incurred by the use of the audio player and thus any hearing damage will be due to the user's behavior and will not be the responsibility or liability of the manufacturer or provider of the audio player.

The prevention of additional sound dosages due to e.g. listening to music is achieved by using the (known) sound attenuation of the earphones and by adaptively controlling the playback volume such that the total sound exposure due to music and the environmental sounds after attenuation by the shielding effect of the earphones does not exceed the level of the environmental sound level.

In some embodiments, the gain may not be directly controlled but rather the determined gain may be a maximum gain. E.g. the portable audio player may allow a user to select a lower volume level than that which corresponds to the ambient sound level. Thus, the target sound level may in some embodiments be a maximum level.

The attenuation effect of the earphone may typically be known e.g. the manufacturer may determine such values during the design, test and manufacturing phases. However, as another option, a dedicated measurement of the attenuation effect may be performed and the resulting data may be provided to the controller.

In addition to the advantage of the system not increasing the overall sound dosage the system further allows an automatic adjustment of the volume of the reproduced audio such that this audio is audible for the specific environmental sound conditions experienced without requiring the user to set the volume to a constantly high level.

As a specific example, the attenuated ambient sound level may be represented by $\langle A^2 \rangle$, the ambient sound level by $\langle B^2 \rangle$ and the audio signal level by $\langle C^2 \rangle$. The drive circuit 203 may apply a gain • to the audio signal C before providing the resulting signal • C to the earphone 105. The sound pressure level from the earphone 105 corresponding to the signal C may be represented as D and thus the sound pressure level generated by the earphone may be determined as •D.

The requirement that no extra sound dosage is incurred by listening to the audio player may then be written as:

$$\langle B^2 \rangle \geq \langle (\alpha D)^2 \rangle + \langle A^2 \rangle,$$

which may be rewritten as:

$$\alpha \leq \frac{\langle B^2 \rangle - \langle A^2 \rangle}{\langle D^2 \rangle}.$$

Thus, the system may provide a maximum gain setting for the audio player. In some embodiments, the gain may directly be set to the value that results in the same sound pressure level as if no headphones were worn, i.e.

$$\alpha = \frac{\langle B^2 \rangle - \langle A^2 \rangle}{\langle D^2 \rangle}.$$

In the example, D may for example be considered to be proportional to C with a proportionality factor of • resulting in:

$$\alpha \leq \frac{\langle B^2 \rangle - \langle A^2 \rangle}{\langle \beta^2 C^2 \rangle}.$$

In the specific example, the gain is restricted to a maximum value (or automatically set to a value) that corresponds to the sound pressure level resulting from the combination of the attenuated ambient sound and the audio reproduction being substantially equally to the sound pressure level of the ambient sound outside the earphone 105.

However, it will be appreciated that in other embodiments other gain restrictions may be used and in particular some variations from the ambient sound level may be implemented.

In many scenarios it may e.g. be advantageous for the target sound pressure level to be within 6 dB of the ambient sound level. For example, it may be considered that some additional sound dosage may be accepted and the target sound pressure level may be set e.g. 3 dB above the ambient sound level. As another example, it may be desired that the sound dosage should be reduced relative to the ambient sound dosage (e.g. in environments where the ambient sound pressure level may potentially cause hearing damage) and thus the target sound pressure level may be set e.g. 25% below the ambient sound level.

In some embodiments, such as when the gain is automatically set to correspond to the ambient sound level, the gain controller 205 may further be arranged to restrict the gain to an interval above a minimum value that corresponds to the reproduced audio sound level having a predetermined minimum value. Thus, the gain controller 205 may not only implement a maximum gain but may also implement a minimum gain. For example, in order to avoid the situation that low ambient sound levels result in the gain dropping to very low values, the gain controller 205 may be arranged to ensure a that the gain has a minimum value corresponding to a suitable level (such as e.g. 70 dB SPL), which is believed to be harmless for long continuous exposure times. This may be particularly advantageous in embodiments wherein the gain controller 205 automatically sets the actual gain rather than just a maximum gain.

The described approach thus allows the sound exposure to the user to automatically be kept within reasonable levels and specifically to be automatically set to correspond to the ambient sound. Thus, the risk of hearing damage may be substantially reduced. Furthermore, this may be achieved with a low complexity approach and may specifically avoid the need for monitoring and accumulating sound dosages over time.

The system is arranged to adapt the gain of the gain controller 205 dynamically and automatically. In many embodiments, the dynamics of the system may be designed such that relatively fast variations in the characteristics of the audio signal and/or the ambient sound can be tracked and compensated.

In many embodiments, the signal level is determined as a low pass filtered signal level having a 3 dB cut-off frequency of no less than 5 Hz. For example, the averaging performed for the energy measure of the audio signal may be extended over a sufficient number of samples to result in a low pass filtering effect that however has a 3 dB cut-off frequency which is 5 Hz or above. In other embodiments, other averaging/low pass filtering than a simple square window averaging may of course be used. Such averaging and low pass filtering may also advantageously have a 3 dB cut off frequency of no less than 5 Hz. In some embodiments, the low pass filtering effect may advantageously have a 3 dB cut off frequency no less than 10 Hz or even 20 Hz.

This may ensure that the gain control will track relatively fast variations in the audio signal level. However, at the same time, such low pass filtering designs may sufficiently protect against the gain variations interacting with the audio to generate undesirable audio artefacts and degradations. In many embodiments, the 3 dB cut-off frequency may advantageously be less than 100 Hz or 200 Hz thereby reducing the risk of the audio being perceived to be modulated by the gain variations.

The same considerations may also be applied to the determination of the ambient sound level and the attenuated ambient sound level. Thus, these values may also be determined with a low pass filtering effect having a 3 dB cut-off frequency of no less than 5 Hz and sometimes even more advantageously no less than 10 Hz or even 20 Hz. Similarly, the cut-off frequency may in many embodiments advantageously be less than 500 Hz.

It will be appreciated that the averaging/low pass filtering characteristics may be different for the different parameters that are estimated. E.g. the averaging applied to the ambient sound level may be different from that of the attenuated ambient sound level and they may both be different from that applied to the audio signal.

Thus, the system of FIG. 2 may in many embodiments advantageously be designed to track the conditions relatively fast. Variations in the order from perhaps a few ms up to perhaps a few 100 ms may be tracked in different embodiments.

The response of the gain controller 205 to the variations in the determined levels may furthermore be designed to be relatively fast. Furthermore, the gain control may be designed to be asymmetric.

Indeed, in many embodiments it has been found to be advantageous that the system reacts very quickly to reduce the gain (e.g. due to quick spikes in the audio signal level) while having a substantially slower recovery time when increasing the gain. In some embodiments, the gain modification may be dependent on a characteristic of the change in the audio level. For example, the system may provide fast recovery after a short peak in the audio level and may provide a slower recovery after a longer period of increased sound level. The approaches may result in a nearly immediate reduction in level for sharp peaks thus avoiding or reducing very high sound exposure at the onset of a loud signal. The immediate reduction at onset is typically not very noticeable, and a gradual increase after a reduction in signal level is also typically not very noticeable.

Indeed, it has in many scenarios been found to be advantageous for the time constant for gain increases to be no less than twice as high as for gain reductions. In some embodiments, enhanced performance has even been found for the time constant for gain increases to be no less than five or ten times as high as for gain reductions.

In many scenarios particularly advantageous performance have been found for the time constant for reducing the gain being no more than 20 msec, or even no more than 10 msec or 5 msec. Similarly, particularly advantageous performance have been found for the time constant for increasing the gain being no more than 200 msec, or even no more than 100 msec.

A time constant may be considered to represent the time it takes the gain to reach 1-1/e•63% of its final (asymptotic) value following a step change. In the specific example, the step change may be a step change in e.g. the signal level of the audio signal and/or the ambient sound.

These design parameters tend to provide an improved performance and in particular may provide an advantageous trade-off between hearing protection, gain setting accuracy and mitigation of undesired audio artefacts.

In some embodiments a more accurate determination of the attenuated ambient sound level may be determined by first processing the microphone signal to reflect the shielding effect more accurately. Specifically, rather than merely assuming a constant attenuation, the frequency response of the shielding provided by the earphone may be taken into consideration.

Specifically, the attenuation processor 213 may be arranged to filter the microphone signal with a frequency response that reflects the frequency response of the ambient sound attenuation of the earphone. For example, a frequency response for the attenuation of the earphone when in use may be provided by the manufacturer (or determined from dedicated measurements) and this frequency response may be approximated by a FIR or IIR filter which is applied to the microphone signal by the attenuation processor 213. Thus, the filter may specifically have a frequency response which is an approximation of the frequency response of the attenuation of the earphone.

It will be appreciated that in some embodiments, the frequency response may be a coarse approximation and may only represent part of the frequency response of the earphone attenuation. Furthermore, it will be appreciated that in some embodiments, the frequency response of the filter applied to the microphone signal may not directly correspond to the frequency response but may only include a contribution relating to this. For example, the attenuation processor 213 may include a filter which has a frequency response that corresponds to the combined frequency response of the attenuation and a desired averaging/low pass filtering.

The consideration of the frequency response of the attenuation may provide a much more accurate consideration of the actual impact of the ambient sound on a user of the headphone.

In some embodiments, the system of FIG. 2 may further take the specific characteristics of the earphone 105 when reproducing sound into consideration. Specifically, the frequency response of the earphone 105 may be considered when determining the audio signal level such that this more accurately reflects the sound pressure level that is generated by the earphone 105.

Figure 3:
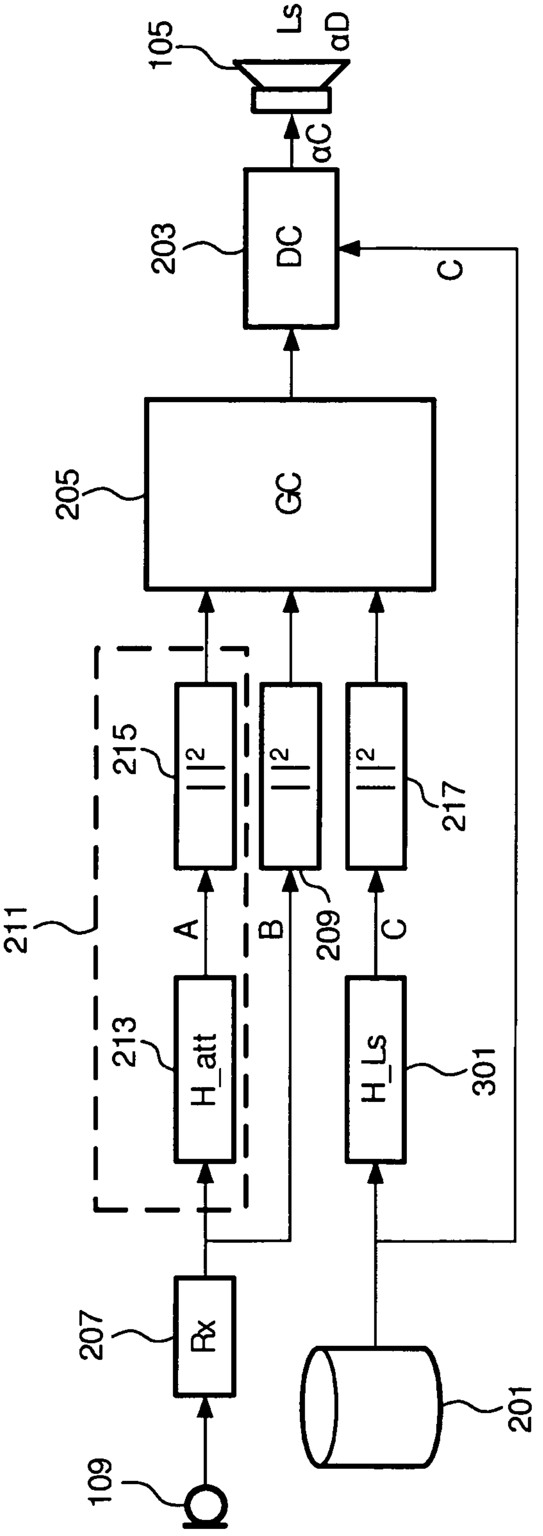
FIG. 3 illustrates an example of a controller for a headphone arrangement in accordance with some embodiments of the invention.

An example of such an embodiment is shown in FIG. 3 where the controller further comprises a filter 301 which is arranged to filter the audio signal with a frequency response reflecting a frequency response of the earphone when reproducing the audio. The filtered audio signal is then provided to the audio signal level processor 217 and is used to determine the audio signal level. Thus, in this embodiments, the controller comprises a filter 301 arranged to filter the audio signal to generate a filtered audio signal, and the audio signal level processor 217 is arranged to determine the audio signal level as an energy measure for the filtered audio signal, where the filter 301 has a frequency response reflecting a frequency characteristic of the earphone.

This may provide improved performance and may especially provide an improved accuracy in setting the gain due to the sound pressure level experienced by the user being more accurately estimated.

In some embodiments, the controller may perform a frequency weighting of one or more of the determined parameters. Specifically, the controller may perform a frequency weighting of one or more of the audio signal level; the ambient sound level; and the attenuated ambient sound level.

It will be appreciated that such a frequency weighting may for example be performed as part of the determination of the parameter or may possibly be performed as a post processing modification of the parameter (e.g. by subsequent filtering).

As a specific example, the frequency weighted parameter may be determined in the frequency domain. For example, the signal on which the parameter is based (the audio signal, the microphone signal or the filtered microphone signal) may first be transformed to the frequency domain e.g. by a suitable Fast Fourier Transform. The resulting frequency values may be weighted followed by a determination of the overall energy level. For example, the parameter value may be determined as:

$$\langle x^2 \rangle = \sum_k (W(k)x(k))^2,$$

where x(k) are the frequency domain samples for the appropriate signal, k is a frequency index (e.g. the FFT bin number) and W(k) is the weight for bin k.

Such a frequency weighting may be highly advantageous in many scenarios as it allows a more accurate determination and representation of the actual impact of sounds on a human. For example, it may reflect the fact that high-frequency signal components have a relatively larger potential for causing hearing damage than low-frequency signal components.

In some embodiments, the controller may be arranged to perform a frequency selective gain adjustment. E.g. in some embodiments, the gain controller 205 may be designed to independently operate on multiple frequency bands.

For example, in some embodiments at least one of the audio signal level, the attenuated ambient sound level and the ambient sound level may be determined as a frequency dependent value, and the gain may in response be determined as a frequency dependent gain.

In some embodiments, at least one of the audio signal level, the attenuated ambient sound level and the ambient sound level may be determined for a plurality of frequency bands, and a gain may be determined for each of the plurality of frequency bands dependent on the parameters of that frequency band. The gains of each frequency band may then be applied separately to the audio signal by the drive circuit 203. For example, the audio signal may be converted into the frequency domain by an FFT, the individual frequency dependent gains may be applied, and the resulting signal may be converted back to the time domain.

Such an approach may allow a more accurate gain control and in particular a more flexible protection against hearing loss.

It will be appreciated that the above description for clarity has described embodiments of the invention with reference to different functional circuits, units and processors. However, it will be apparent that any suitable distribution of functionality between different functional circuits, units or processors may be used without detracting from the invention. For example, functionality illustrated to be performed by separate processors or controllers may be performed by the same processor or controllers. Hence, references to specific functional units or circuits are only to be seen as references to suitable means for providing the described functionality rather than indicative of a strict logical or physical structure or organization.

The invention can be implemented in any suitable form including hardware, software, firmware or any combination of these. The invention may optionally be implemented at least partly as computer software running on one or more data processors and/or digital signal processors. The elements and components of an embodiment of the invention may be physically, functionally and logically implemented in any suitable way. Indeed the functionality may be implemented in a single unit, in a plurality of units or as part of other functional units. As such, the invention may be implemented in a single unit or may be physically and functionally distributed between different units, circuits and processors.

Although the present invention has been described in connection with some embodiments, it is not intended to be limited to the specific form set forth herein. Rather, the scope of the present invention is limited only by the accompanying claims. Additionally, although a feature may appear to be described in connection with particular embodiments, one skilled in the art would recognize that various features of the described embodiments may be combined in accordance with the invention. In the claims, the term comprising does not exclude the presence of other elements or steps.

Furthermore, although individually listed, a plurality of means, elements, circuits or method steps may be implemented by e.g. a single circuit, unit or processor. Additionally, although individual features may be included in different claims, these may possibly be advantageously combined, and the inclusion in different claims does not imply that a combination of features is not feasible and/or advantageous. Also the inclusion of a feature in one category of claims does not imply a limitation to this category but rather indicates that the feature is equally applicable to other claim categories as appropriate. Furthermore, the order of features in the claims do not imply any specific order in which the features must be worked and in particular the order of individual steps in a method claim does not imply that the steps must be performed in this order. Rather, the steps may be performed in any suitable order. In addition, singular references do not exclude a plurality. Thus references to "a", "an", "first", "second" etc do not preclude a plurality. Reference signs in the claims are provided merely as a clarifying example shall not be construed as limiting the scope of the claims in any way.

The invention claimed is:

1. A controller for a headphone arrangement comprising:

an audio drive circuit for generating a drive signal for an earphone of the headphone arrangement from an audio signal, and for feeding the drive signal to the earphone to cause the earphone to reproduce the audio signal at a first sound level;

a first circuit for determining a signal level of the audio signal;

a receiver for receiving a microphone signal from a microphone;

a second circuit for determining an ambient sound level from the microphone signal;

a third circuit for determining an attenuated ambient sound level for the user from the microphone signal, said third circuit including an attenuation processor for processing the microphone signal corresponding to an attenuation provided by the earphone to ambient sound; and a gain controller for controlling a gain of the audio drive circuit for the audio signal, said gain controller selectively increasing or decreasing the gain of the audio drive circuit in response to the ambient sound level, the attenuated ambient sound level and the signal level of the audio signal.

2. The controller as claimed in claim 1, wherein the gain controller is arranged to determine a target sound pressure level for the first sound level in response to the ambient sound level and the attenuated ambient sound level, and to restrict the gain of the audio drive circuit to not be above a first gain resulting in the combination of the attenuated ambient sound level and the first sound level corresponding to the target sound pressure level.

3. The controller as claimed in claim 2, wherein the target sound pressure level is within 6 dB of the ambient sound level.

4. The controller as claimed in claim 2, wherein the target sound pressure level is substantially equal to the ambient sound level.

5. The controller as claimed in claim 2, wherein the gain controller arranged to restrict the gain to an interval above a minimum value corresponding to the first sound level having a predetermined minimum value.

6. The controller as claimed in claim 1, wherein the first circuit is arranged to filter the audio signal with a frequency response reflecting a frequency response of the earphone when reproducing the audio signal.

7. The controller as claimed in claim 1, wherein the third circuit is arranged to filter the microphone signal with a frequency response reflecting a frequency response of the ambient sound attenuation of the earphone.

8. The controller as claimed in claim 1, wherein the first circuit is arranged to generate the signal level as a low-pass filtered signal level having a 3 dB cut-off frequency of no less than 5 Hz.

9. The controller as claimed in claim 1, wherein the second circuit is arranged to generate the ambient sound level as a low-pass filtered ambient sound level having a 3 dB cut-off frequency of no less than 5 Hz.

10. The controller as claimed in claim 1, wherein the gain controller decreases the gain using a first time constant no more than 20 msec.

11. The controller claimed in claim 1, wherein the gain controller increases the gain using a second time constant no more than 200 msec.

12. The controller as claimed in claim 1, wherein the gain controller decreases the gain using a first time constant, and increases the gain using a second time constant, said second time constant being no less than twice as high as the first time constant.

13. The controller as claimed in claim 1, wherein the gain controller is arranged to perform a frequency weighting of at least one of:

the signal level;

the ambient sound level; and the attenuated ambient sound level.

14. The controller as claimed in claim 1, wherein the gain controller is arranged to perform a frequency selective gain adjustment.

15. A method of gain control for a headphone arrangement, the method comprising:

generating a drive signal for an earphone of the headphone arrangement from an audio signal;

feeding the drive signal to the earphone to cause the earphone to reproduce the audio signal;

determining a signal level of the audio signal;

receiving a microphone signal from a microphone;

determining an ambient sound level from the microphone signal;

determining an attenuated ambient sound level for the user from the microphone signal and an attenuation corresponding to an attenuation provided by the earphone to ambient sound; and controlling a gain in the generating of the drive signal by selectively increasing or decreasing the gain in response to the ambient sound level, the attenuated ambient sound level and the signal level.

* * * * *